United States Patent [19]

Ogawa et al.

[11] 4,048,646
[45] Sept. 13, 1977

[54] DUAL-GATE SCHOTTKY BARRIER GATE FET HAVING AN INTERMEDIATE ELECTRODE AND A METHOD OF MAKING SAME

[75] Inventors: Masaki Ogawa; Takashi Furutsuka; Masaoki Ishikawa, all of Tokyo, Japan

[73] Assignee: Nippon Electric Company, Limited, Tokyo, Japan

[21] Appl. No.: 661,256

[22] Filed: Feb. 25, 1976

[30] Foreign Application Priority Data

Feb. 26, 1975 Japan .................................. 50-23744

[51] Int. Cl.² ..................... H01L 29/48; H01L 29/80; H01L 23/48
[52] U.S. Cl. ........................................ 357/15; 357/22; 357/68
[58] Field of Search ............................. 357/22, 15, 68

[56] References Cited

U.S. PATENT DOCUMENTS 3,706,014  12/1972  Dean ...................................... 357/15

OTHER PUBLICATIONS

IBM Tech. Bulletin — vol. 15, No. 2, July 1972, pp. 532-533, "Double Gate MESFET Memory Cell" — W. Baechtold.

*Primary Examiner*—Edward J. Wojciechowicz
*Attorney, Agent, or Firm*—Hopgood, Calimafde, Kalil, Blaustein & Lieberman

[57] ABSTRACT

A dual-gate Schottky barrier gate field effect transistor is provided with an intermediate electrode between a first and a second gate electrode. This intermediate electrode forms an ohmic contact with a semiconductor substrate of the transistor. The transistor is produced by etching a first film formed on a planar surface of the substrate by the use of a pair of mask pieces to leave a pair of gate electrodes narrower than the mask pieces and projecting a metal capable of forming an ohmic contact with the semiconductor towards the planar surface perpendicularly thereof. The projected metal provides source and drain electrode on both sides of the gate electrode pair and an intermediate electrode between the gate electrodes. The intermediate electrode may be left floating during operation.

13 Claims, 23 Drawing Figures

DUAL-GATE SCHOTTKY BARRIER GATE FET HAVING AN INTERMEDIATE ELECTRODE AND A METHOD OF MAKING SAME

BACKGROUND OF THE INVENTION

This invention relates to a dual-gate Schottky barrier gate field effect transistor and to a method of manufacturing the same.

The dual-gate Schottky barrier field effect transistor ("Schottky barrier gate field effect transistor" will be briefly called "MESFET" hereinafter) is a semiconductor device having an ohmic source electrode, a first Schottky barrier gate electrode, a second Schottky barrier gate electrode, and an ohmic drain electrode disposed in series on an isolated n-type semiconductor substrate, and each section of the first and the second halves of the device is considered to form a single-gate MESFET. The device is commonly used as cathode type amplifier and in some cases as a modulator, a demodulator, or a mixer.

When the device is used as a cascode amplifier with power gain control at a low noise level, the noise figure or level of the device is mainly determined by the first section and the power gain is controlled by the second section, though both two sections contribute to the amplifying function. The device has not broadly been used as a cascode amplifier because the noise level of the device is not so low as is required. Another serious problem is that it is very difficult to produce a device having extremely short dimensions economically on a mass-production scale.

A proposal has been made by Asai et al. in "The 5th Conference on Solid State Devices, Tokyo (1973 International)", Japan Society of Applied Physics, Vol. 43 (1974), P. 442, to reduce the thickness of the semiconductor substrate under the first gate electrode for improvement of the electrical characteristics of the device. It seems difficult, however, to manufacture such devices on a mass-production scale because the electron beam lithography or the like which is not suitable for mass-production must be used as a technique for micro fabrication. Another proposal has been made by Ziel and Tankagi in "Improvement in the tetrode FET noise figure by neutralization and tuning, " IEEE J. Solid-State Circuits (Corresp.), Vol. SC-4 (June 1969), pp. 170-172, to provide an ohmic contact electrode connected to a neutralization circuit between the two gate electrodes for reducing the noise level. Formation of the neutralization circuit, however, becomes more difficult as the operating frequency rises to that of X-band.

SUMMARY OF THE INVENTION

It is therefore an object of this invention to provide a dual-gate MESFET having low noise at high frequencies.

It is another object of this invention to provide a dual-gate MESFET capable of carrying out power gain control at low noise level and over a wide range of power gain, and which is usable at high frequencies.

It is a further object of this invention to provide a method of manufacturing a dual-gate MESFET adapted for mass-production.

It is a still further object of this invention to provide a method of manufacturing a dual-gate MESFET for use at high frequencies on a mass-production scale.

It is a specific object of this invention to provide a method of manufacturing a dual-gate MESFET having a passivation mask and very stable characteristics for use at high frequencies on a mass-production scale.

A dual-gate Schottky barrier gate field effect transistor according to this invention starts from a substrate of a semiconductor having a planar surface, a pair of first pieces on the planar surface, and a pair of second pieces on the planar surface on both sides of the first pair of pieces. The first pieces are for use as a first and a second gate electrode. The second pieces are for use as a source and a drain electrode. In accordance with this invention, the transistor further comprises an intermediate piece on the planar surface between the first pieces with a space left between the intermediate piece and each of the first pieces. The intermediate piece is made of a metal capable of forming an ohmic contact with the semiconductor at least at its portion contiguous to the planar surface. The second piece disposed between the first pieces, or an intermediate piece, may be left floating or may be used as an intermediate electrode.

A method of manufacturing a dual-gate Schottky barrier gate field effect transistor according to this invention is based on a known method disclosed in United States Patent Application Ser. No. 450,793 filed by Masaoki Ishikawa and Masaki Ogawa, two of the present applicants, on Mar. 13, 1974, which comprises the steps of providing a substrate of a semiconductor having a planar surface, forming a first film of a first metal on the planar surface, forming mask means locally on the first film to leave predetermined portions of the first film uncovered, removing the uncovered first film portions and those parts of the first film which are contiguous to the uncovered portions under the mask means to leave as first piece means that portion of the first film unremoved which extends between the contiguous parts, and projecting a second metal toward the planar surface substantially perpendicularly thereof to form a second film on the mask means and on those areas of the planar surface which are exposed to the projected second metal, thereby providing a plurality of second pieces by the second film portions deposited on the exposed planar surface areas with spaces left between the first piece means and the second pieces. The first metal is capable of forming a Schottky barrier with the semiconductor. The second metal is capable of forming an ohmic contact with the semiconductor. In accordance with this invention, the mask forming step is carried out to form as the mask means a pair of mask pieces with the uncovered portions left on both sides of the mask piece pair and between the mask pieces. As a result, the removing step is carried out to leave as the first piece means a pair of first pieces. As a further result, the projecting step is carried out to form as the second pieces a pair of second pieces on both sides of the first piece pair and an intermediate piece between the first pieces.

DESCRIPTION OF THE PREFERRED EMBODIMENTS

Referring to FIG. 1, a method of manufacturing a dual-gate MESFET according to a first embodiment of the present invention will be described at first.

Figure 1A:
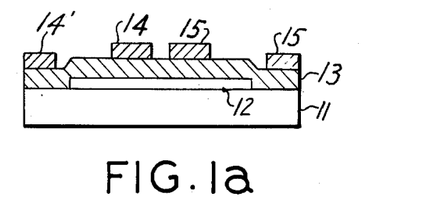
FIGS. 1a–1c show cross-sectional views of a dual-gate MESFET being manufactured by a method according to a first embodiment of the instant invention.

In FIG. 1(a), a gallium arsenide crystal 11 having a high electrical resistivity has an n-type gallium arsenide crystal layer 12 of an electron density of about $2 \times 10^{17}$ cm$^{-3}$, a length of about 70 microns, and a thickness of about 0.2 micron epitaxially grown thereon. The crystal layer 12 serves as a substrate having a planar surface. After chemical cleaning of the planar surface, a first film 13 of a first metal capable of forming a Schottky barrier with the n-type gallium arsenide is formed on the entire surface of the crystal layer 12 by way of evaporation in vacuum to a thickness of about 0.6 micron. Highly pure aluminium is the most preferable as the first metal because it has very low resistivity and because the Schottky barrier thereby formed will not lose its excellent characteristics even at elevated temperatures. A pair of photoresist mask pieces or elements 14 and 15 of a length of 3 microns and of a thickness of 0.5 micron are locally formed on the first film 13 with a distance of about 2 microns left therebetween to leave a pair of wide predetermined portions of the first film 13 uncovered on both sides of the mask piece pair and another 2-micron long portion between the mask pieces 14 and 15. The distance thus left corresponds to that of an intermediate piece to be described later. The mask pieces 14 and 15 are easily formed by the use of conventional photo-contact lithography. In practice, another pair of mask pieces 14' and 15' are formed along both edge portions of the first film 13. The "length" as called herein refers to the measure along the horizontal lines in FIGS. 1–3, 8, and 10.

Figure 1B:
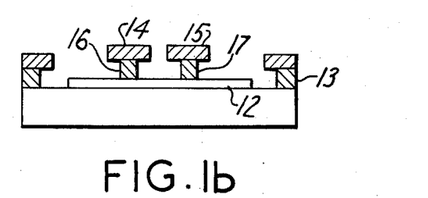

In FIG. 1(b), the first film 13 is removed at the predetermined or uncovered portions and at those parts of the first film 13 underlying the mask pieces 14 and 15 contiguous to the uncovered portions to leave a pair of first pieces 16 and 17. The contiguous parts are removed to a depth of 1 micron from an interface between the underlying and the uncovered portions. Each of the first pieces 16 and 17 thus has a length of 1 micron. For the aluminium film 13, the removal may be carried out by chemical etching by the use of an aqueous solution of phosphoric acid at a temperature of 50° C in about three minutes. It has been confirmed possible to precisely control the chemical etching and to provide the short first pieces 16 and 17 without any break or snapping therein. The depth of removal is adjusted by controlling the etching time either by watching the removal of the film 13 with a microscope when the mask pieces 14 and 15 are of a transparent mafterial or by measuring the electrical resistance of the film pieces being etched. If desired, it is possible in this manner to form a first piece 16 or 17 of a length of 0.5 micron from a one-micron thick aluminium film with an accuracy of 0.1 micron and without any defects by the use of the mask pieces 14 or 15, about 2 microns long. Incidentally, the removal may be carried out with excellent results by resorting at first either to ion milling or sputter milling for the uncovered portions and secondly to chemical etching for the contiguous parts.

Figure 1C:
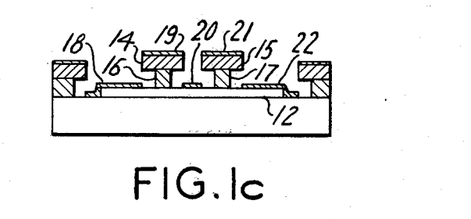

In FIG. 1(c), a second metal capable of forming an ohmic contact with the n-type semiconductor is projected either by evaporation or sputtering towards the planar surface substantially perpendicuarly thereof to form at least five second pieces 18, 19, 20, 21 and 22 of a thickness of about 0.1 micron. Short spaces of about 1 micron are left between the neighboring first and second pieces. Gold-germanium is preferable as the second metal. The second piece 20 formed between the first pieces 16 and 17 is the intermediate piece.

Figure 1D:
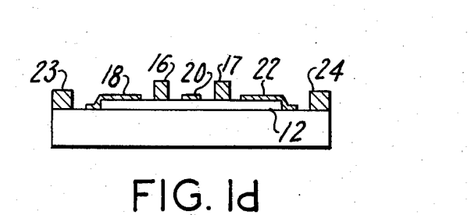
Figure 1E:
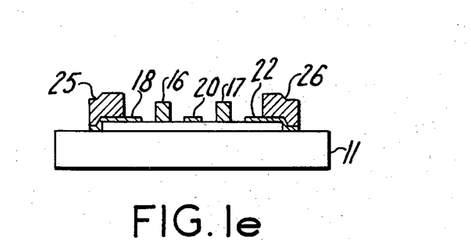

In FIG. 1(d), photoresist mask pieces 14 and 15 are removed by the use of an organic solvent, such as acetone, together with the second pieces 19 and 21 lying thereon. The resulting assembly is then heat-treated in a hydrogen atmosphere at a temperature of 450° C for about 30 seconds to form layers or films of ohmic contacts between the n-type gallium arsenide crystal layer 12 and the remaining second pieces 18, 20, and 22 and further to make the first pieces 16 and 17 tenaciously attach to the crystal layer 12. First pieces 23 and 24 formed together with the pieces 16 and 17 are then removed. In FIG. 1(e), a pair of gold film pieces 25 and 26 are formed on the second pieces 18 and 22, respectively, by plating or evaporating. These compound pieces serve as the source and drain electrodes, respectively.

Figure 2:
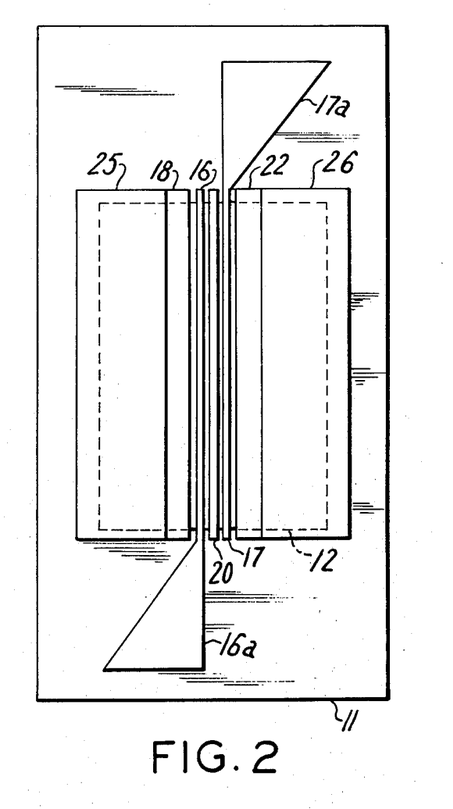
FIG. 2 is a plan of a dual-gate MESFET manufactured by the method illustrated with reference to FIG. 1.

Referring to FIG. 2, a dual-gate MESFET made by the method described above comprises an n-type gallium arsenide crystal layer 12 shown with broken lines. In general, the layer 12 has a width, perpendicular to the length defined hereinabove, of from one to several hundred microns. Although not illustrated with reference to FIG. 1, the mask pieces 14 and 15 are extended to the surface of the crystal 11 to provide the first pieces 16 and 17 with areas 16a and 17a for bonding the gate electrodes 16 and 17 to a pair of terminals or strip lines (not shown).

In a modification of the first embodiment, the mask pieces 14 and 15 may be made of a metal, such as hafnium, molybdenum, or chromium. In this case, the mask pieces 14 and 15 and the overlying second pieces 19 and 21 need not be removed. Removing of the mask made of such a metal is, if needed, made by the use of, for instance, hydrochloric acid.

In the first embodiment in which a gallium arsenide crystal layer 12 is used as a semiconductor substrate, platinum, chromium, molybdenum, titanium, gold, or a combination of any of them may also be used as the first metal. A gold-germanium-nickel alloy or a nickel-germanium alloy may also be used as the second metal. When the metal film is composed of a plurality of metal layers, the above description applies to the layer contiguous to the semiconductor substrate 12.

Further, silicon, indium phosphide, indium arsenide besides gallium arsenide may also be used as a semiconductor substrate 12.

Referring to FIG. 3, a method according to a second embodiment of this invention is for manufacturing a dual-gate MESFET which has a passivation mask film deposited on an exposed surface of a substrate of gallium arsenide crystal. The passivation mask film is used to protect the gallium arsenide crystal from contamination and to reduce the surface state density.

Figure 3A:
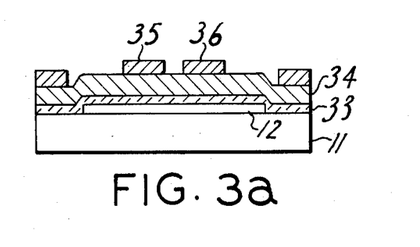
FIGS. 3a–3j show cross-sectional views of a dual-gate MESFET being manufactured by a method according to a second embodiment of this invention.

In FIG. 3(a), a gallium arsenide crystal 11 having a high electrical resistivity has an isolated n-type gallium arsenide crystal layer 12 of an electron density of about $2 \times 10^{17}$ cm$^{-3}$ and a thickness of 0.2 micron epitaxially-grown thereon. The n-type crystal layer 12 serves as a substrate having a planar surface. After chemical cleaning of the planar surface, a passivation mask material, such as silicon dioxide, resistant to a first corrosive agent, such as an aqueous solution of phosphoric acid, susceptible to a second corrosive agent, such as hydrofluoric acid, and resistant to a third corrosive agent, such as hydrochloric acid, is deposited on the planar surface to form a first mask film 33 of a thickness of 0.2 micron. As will appear later, the first mask film 3 provides passivation layer pieces.

A second masking material, such as aluminium, susceptible to the first corrosive agent, is deposited on the first mask film 33 to form a second mask film 34 of a thickness of 0.6 micron. A pair of mask elements 35 and 36 of a length of 3 microns and of a thickness of 0.5 micron are formed of a predetermined masking material on the second mask film 34 with a distance of 2 microns left therebetween to leave predetermined portions of the second mask film 34 uncovered. The mask elements 35 and 36 are preferably made of a photoresist material. The distance of 2 microns corresponds to the length of an intermediate piece to be described later. The photoresist mask elements 35 and 36 are easily formed by the use of conventional photocontact lithography.

Figure 3B:
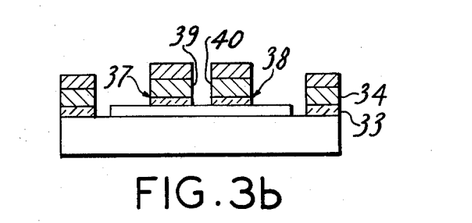

In FIG. 3(b), the second mask film 34 and the first mask film 33 are removed at predetermined or uncovered portions thereof to leave a pair of two-layer pieces 37 and 38 by the use of an ion milling or sputter milling technique. The two-layer piece 37 or 38 consists of those portions of the first and second mask films 33 and 34 which underlie the photoresist mask elements 35 and 36 and each of the two-layer pieces has a pair of side surfaces substantially perpendicularly of the planar surface.

Figure 3C:
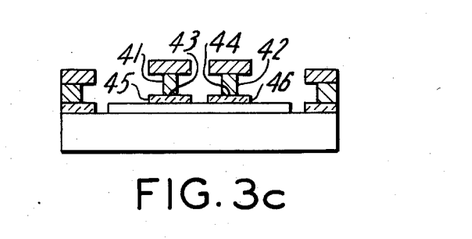

In FIG. 3(c), two underlying parts 39 and 40 of the second mask film are removed at those parts which are contiguous to the side surfaces of the two-layer piece to leave a pair of second mask pieces 41 and 42 of a length of one micron. If aluminium is used as a second mask material, the removal may be carried out by the use of an aqueous solution of phosphoric acid at a temperature of 50° C as the first corrosive agent, for three minutes. The second mask pieces 41 and 42 lie on central areas 43 and 44 of the underlying first mask film pieces 45 and 46, respectively.

Figure 3D:
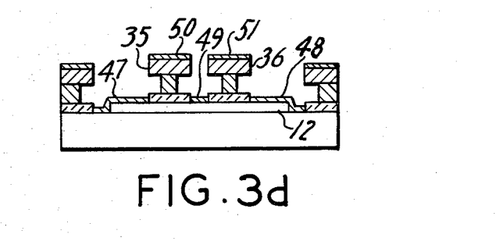

In FIG. 3(d), a first metal capable of forming an ohmic contact with the n-type gallium arsenide, such as a gold-germanium alloy which may include nickel, is projected either by evaporation or sputtering towards the planar surface of the substrate 12 substantially perpendicularly thereof to form first metal pieces 47 and 48 on both sides of the first mask piece pair 45 and 46, intermediate piece 49 between the first mask pieces, and ohmic metal pieces 50 and 51 on the photoresist mask elements 35 and 36. The intermediate piece 49 has a first metal surface area substantially parallel to the planar surface of the substrate.

Figure 3E:
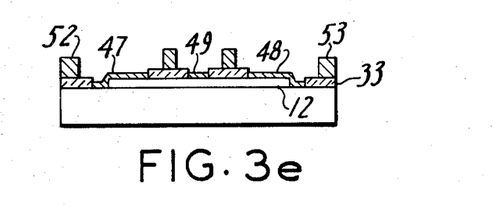

In FIG. 3(e), the photoresist mask elements 35 and 36 are removed by the use of an organic solvent, such as acetone, together with the ohmic metal pieces 50 and 51. The assembly is then heat-treated in a hydrogen atmosphere at a temperature of 450° C for about 30 seconds to form tenacious ohmic contacts between the n-type gallium arsenide crystal layer 12 and the first metal pieces 47, 48 and 49. The assembly shown in this figure is similar to that shown in FIG. 1(d) except that the first mask pieces are disposed on the exposed planar surface between the intermediate piece 49 and the first metal pieces 47 and 48.

Figure 3F:
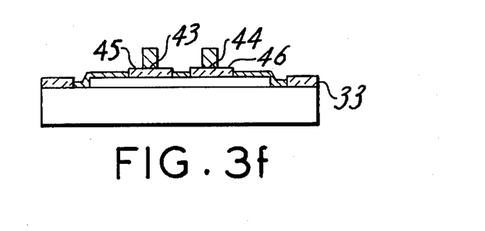

In FIGS. 3(e) and (f), excessive portions 52 and 53 of the second mask 34 on the passivation mask film 33 which were produced in the above-mentioned steps are removed.

Figure 3G:
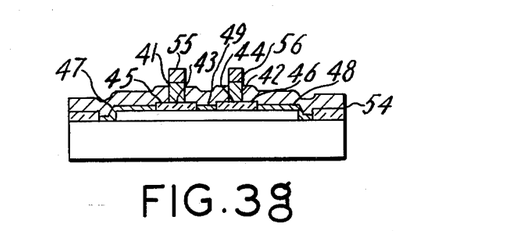

In FIG. 3(g), a third masking material, such as chromium, resistant to the first and second corrosive agents but susceptible to the third corrosive agent, is projected towards the surface of the intermediate piece substantially perpendicular thereof to form a third mask film 54 of a thickness of 0.45 micron on said first metal pieces 47 and 48, the intermediate film 49, the second mask pieces 41 and 42, and those parts of the underlying first mask film pieces 45 and 46 less the central areas 43 and 44.

Figure 3H:
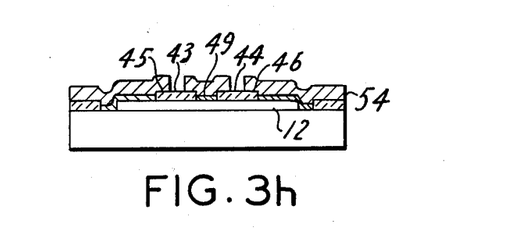

In FIG. 3(h), the second mask piece portions 41 and 42 are removed by the first corrosive agent together with the third mask pieces 55 and 56 which lie on the second mask pieces 41 and 42 to expose locally the passivation mask pieces 45 and 46, at the central areas 43 and 44. Even when the second mask pieces 41 and 42 are covered by the third mask film 54 at their side surfaces, removal thereof together with the third mask pieces 55 and 56 is possible because small leakage paths, though not shown in FIG. 3(h), are inevitably formed along at least a portion of the interface between the third mask film 54 and the second mask pieces 41 and 42 unless specific apparatus is employed during the deposition of the third mask film 54 on the substrate.

Figure 3I:
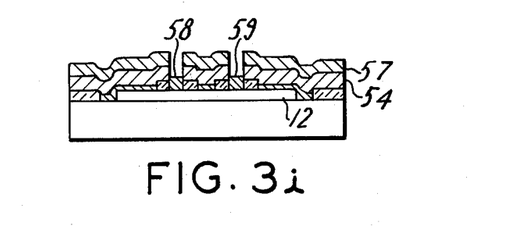

In FIG. 3(i), the first mask pieces 45 and 46 are partially removed at the exposed central areas 43 and 44, respectively, by the second corrosive agent to expose the surface of the substrate 12 at the central areas. Thereafter, a second matal capable of forming a Schottky barrier with the semiconductor, such as aluminium, resistive to the third corrosive agent, is projected towards the third mask film 54 substantially perpendicularly thereof to form a second metal film 57. The second metal films deposited on the exposed areas 43 and 44 form a pair of second metal pieces 58 and 59.

Figure 3J:
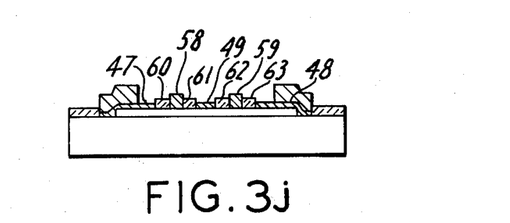

In FIG. 3(j), the third mask film is removed by the third corrosive agent together with the second metal film 57 thereon. The second metal pieces 58 and 59 of a length of 1 micron serve as the first and second Schottky barrier gate electrodes, respectively, and all of spaces formed between the first metal pieces 47–49 and the second metal pieces 58 and 59 are covered with two pairs of the passivation mask pieces 60, 61, 62 and 63.

In a method according to a third embodiment of this invention, highly resistive gallium arsenide film or gallium aluminium arsenide mixture film deposited by a chemical vapor deposition method, liquid-phase epitaxial growth method or evaporation method may be used as a passivation mask film 33 with excellent results. Using these films, the surface state density of n-type gallium arsenide is predominantly reduced, and the device equipped with these passivation masks is very stable in its behaviors. In this case, a composite solvent consisting of 3 parts of sulphuric acid, 1 parts of hydrogen peroxide, and 1 part of water by volume is preferred as the second corrosive agent mentioned in conjunction with the second embodiment. Silicon nitride or aluminium oxide is also used as a passivation mask film. In this case, hot-phosphoric acid is chosen as the second corrosive agent. As the second metal forming a Schottky barrier with the n-type gallium arsenide, platinum, chromium, molybdenum, titanium, gold, or a combination of any of them including aluminum may be used in place of aluminum only. Dual-gate MESFET's manufactured by methods according to the first embodiment were exported from Japan to the United States of America after the filing date of the original Japanese patent application No. 23744/1975. In the U.S., some of these MESFET's were sold with passivation mask pieces formed on the planar surface between the respective metal pieces 47, 48, 49, 58, and 59.

One of the most important features of the methods according to the present invention is that a length of 0.5 micron or less, to say nothing of one micron, can be realized with a precision of 0.1 micron or less in determining the length of any electrodes or spaces by the use of the conventional photo-contact lithography techniques. Practically, this invention is preferably applied to mass-production of dual-gate MESFET's when the spaces between electrodes are about 2 microns or less becasue the accuracy of the dimensions of the spaces or the first pieces degrades when the dimensions are wider than about 2 microns. Another important feature is that an intermediate piece which plays a very important role in the improved dual-gate MESFET is automatically formed together with second pieces for use as the source and drain electrodes. Conversely speaking, the manufacturing method according to the present invention can not be used in producing the conventional dual-gate MESFET lacking the intermediate piece.

As will be understood from the description given above of the methods according to this invention, a dual-gate MESFET according to this invention comprises an intermediate piece 20 or 49 on a planar surface of a semiconductor substrate 12 between a pair of Schottky barrier pieces 16 and 17 (FIG. 1) or 58 and 59 (FIG. 3). The intermediate piece 20 or 49 is in ohmic contact with the planar surface, such as a pair of ohmic contact pieces 18 and 22 (FIG. 1) or 47 and 48 (FIG. 3). A MESFET according to this invention may be manufactured with low cost and on an industrial scale, when the maximum operating frequency therefor is below about 10GHz, even by a conventional method adapted to the structure of the MESFET as in respect to the mask pattern. When the maximum operating frequency exceeds about 10GHz, the Schottky barrier pieces and the spaces between each thereof and the adjacent ohmic contact piece of a dual-gate MESFET have to be formed with a length of 1 micron or less and with a precision of 0.1 micron. It, therefore, becomes necessary with the conventional method to resort to electron beam lithography that raises the cost due to an expensive installation and is not well applicable to mass-production because of the time required to carry through. Even under the circumstances, the method according to this invention is economical because of the "lithography" employed is not the electron beam lithography but the photo-contact lithography.

Referring now to FIGS. 4 to 7, description will be made of electrical characteristics dual-gate MESFET according to the invention as compared to that of conventional dual-gate MESFETS. Several of the characteristics illustrated in FIGS. 4 and 5 were measured by supplying an input signal to a first gate electrode, nearer to a source electrode, of a dual-gate MESFET through a tuner and a bias circuit and by deriving an output signal from a drain electrode through another tuner and another bias circuit. The former tuner is for minimum-noise-matching the MESFET. The latter tuner is for maximum-gain-matching the MESFET. An intermediate piece of a dual-gate MESFET according to this invention was left floating. In other words, the intermediate piece was neither D.C. baised nor connected to any matching circuit.

Figure 4:
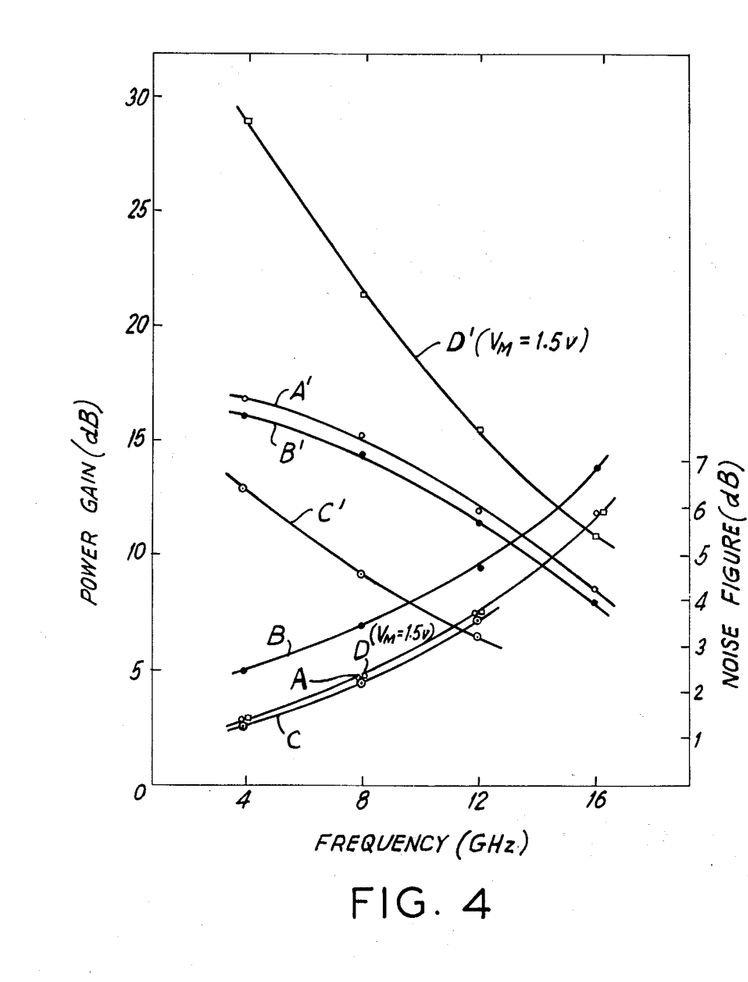
FIG. 4 shows electrical characteristics of dual-gate MESFET's manufactured by a method according to the first or second embodiment of this invention, a conventional dual-gate MESFET, and a single-gate MESFET.

In FIG. 4, the abscissa gives the frequency of the input signal. Curves A and A' show the minimum noise figure and the power gain, respectively, for a dual-gate MESFET according to this invention. Curves B and B' show those of a conventional MESFET for reference and curves C and C' show those of a single-gate MESFET. The substrate of these MESFET's was made of gallium arsenide. In order to achieve the minimum noise figure, the drain voltage and the drain currents were respectively kept at 4 volts and 10mA for the dual-gate MESFET's and 2 volts and 10mA for the single-gate MESFET. The D.C. bias voltage for the second gate electrodes of the dual-gate devices was always maintained at 1 volt. Curves D and D' will be mentioned later. The curves B, B', C, and C' clearly point out the known facts that a conventional dual-gate MESFET is superior to a single-gate MESFET with respect to the power gain by 3 to 4dB but inferior to the latter as regards the minimum noise figure by about 1dB. From the curves A and A', it has now turned clear that a dual-gate MESFET according to this invention has a higher power gain than a conventional dual-gate MESFET and yet nearly as low a minimum noise figure as a single-gate MESFET.

The following are believed to be the reasons why a dual-gate MESFET according to this invention has such a excellent minimum noise figure:

It is known that the minimum noise figure depends on the length of that region of the semiconductor substrate in which the electric field is higher than a certain value that is optimum to render the noise figure low. When the semiconductor is gallium arsenide, the optimum value is 3kV/cm. In MESFET's, the electric field present in the semiconductor substrate under the gate electrode is stronger than that present in other regions. The electron current flowing in a conventional dual-gate MESFET through a narrow channel confined by the depletion layer under each gate electrode is continuous to the electron current flowing uniformly through a cross-section taken in the substrate between the gate electrodes. Accordingly, the region where the strong electric field is present is somewhat extended from the channel under the first gate electrode towards the second section mentioned in the preamble of the instant specification. This makes the minimum noise figure of a conventional dual-gate MESFET appreciably larger than that of a single-gate MESFET. In contrast, the electron current flows in an MESFET according to this invention from the first section to the intermediate piece 20 or 49 unaffected by the presence of the second section even with the intermediate piece kept floating so long as the length of the intermediate piece is two to three times as large as the thickness of the semiconductor substrate 12. This allows the device according to this invention maintain the minimum noise figure as low as a single-gate MESFET. According to the methods described with reference to FIGS. 1 and 3, the thickness of semiconductor substrate 12 is about 0.2 micron and the length of intermediate piece 20 or 49 is about 2 microns. The intermediate piece may be shortened, however, to a length of 0.5 micron or less without a substantial increase of the minimum noise figure.

A dual-gate MESFET according to this invention has, even with the intermediate piece kept floating, almost as low a minimum noise figure as a dual-gate MESFET proposed in the Ziel et al. article where an ohmic contact electrode, very similar at a first glance to the intermediate piece, is accompanied by an indispensable neutralization circuit as mentioned in the preamble of the present specification. It has now become clear that a dual-gate MESFET having an intermediate or an ohmic contact piece has in intrinsically low noise figure even when no circuit is connected thereto. In other words, the noise figure is lowered by the intermediate piece rather than by the accompanying circuit. The reasons why Ziel et al. failed to point out this astonishing result may be due to the fact that they proposed their dual-gate MESFET merely from the results of calculation and experiments carried out with two series-connected single-gate MESFET rather than actually with a discrete dual-gate MESFET.

Figure 5:
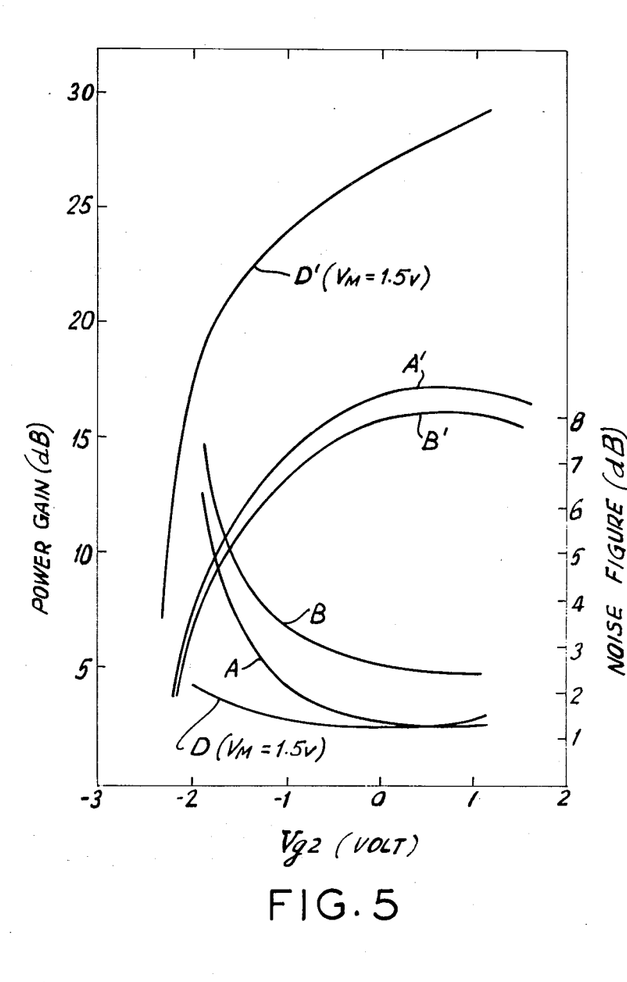
FIG. 5 shows electrical characteristics of dual-gate MESFET's according to this invention and a conventional dual-gate MESFET.

In FIG. 5, the abscissa represents the D.C. bias voltage $V_{g2}$ applied usually for power gain control to the second gate electrodes of dual-gate MESFET's. As in FIG. 4, curves A and A' show the noise figure and the power gain, respectively, of an MESFET according to this invention. Curves B and B' show those of a conventional one. As thus far described, the curve A is lower than the curve B while the curve A' runs generally higher than the curve B'. The curves A and A', however, show that application of a deep negative D.C. bias voltage $V_{g2}$ to the second gate electrode in order to achieve larger power gain control by adjustment of the bias voltage adversely affects the minimum noise figure. Accordingly, an MESFET according to this invention is most preferably used as an amplifier of a low noise level and of a high and constant power gain if the intermediate piece is kept floating.

Figure 6:
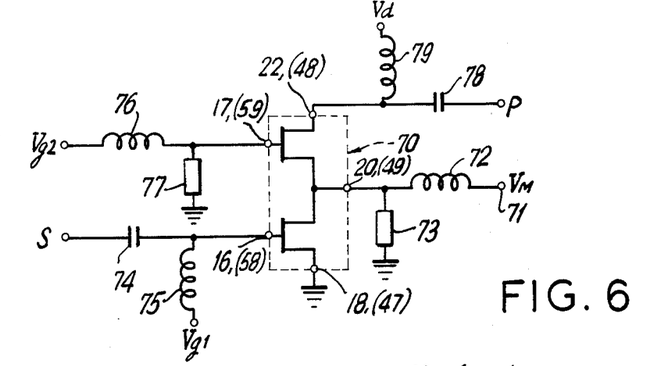
FIG. 6 shows a circuit for operating a dual-gate MESFET according to this invention with a D.C. biased intermediate electrode.

In FIG. 6, a dual-gate MESFET 70 according to this invention has its intermediate piece 20 or 49 coupled to a bias terminal 71 of a D.C. bias voltage $V_M$ through a series inductor 72 and a parallel matching circuit 73. An input signal S is supplied to the first gate piece 16 or 58 through a capacitor 74 for blocking a first gate biasing D.C. voltage $V_{g1}$ supplied through an inductor 75. As has already been mentioned, the second gate piece 17 or 59 is supplied with a second gate biasing D.C. voltage $V_{g2}$ for the power gain control through a series inductor 76 and a parallel matching circuit 77. An output signal P is taken out of the drain piece 22 or 48 through a series capacitor 78. The drain piece 22 or 48 is supplied with a drain bias D.C. voltage $V_d$ through an inductor 79. The source piece 18 or 47 is grounded. It is preferred that the inductor 72 for the intermediate piece 20 or 49 is formed on the surface of the semiconductor crystal 11 as will later be described with reference to FIG. 10.

Referring back to FIGS. 4 and 5, curves D and D' show the noise figure and the maximum power gain, respectively, of an MESFET according to this invention with the intermediate piece 20 or 49 D.C. biased with the circuit illustrated with reference to FIG. 6. Ziel et al. have proven that a neutralization circuit serves to reduce, in cooperation with the ohmic contact electrode, the noise figure of a dual-gate MESFET. It has, however, not been anticipated that the D. C. bias voltage $V_M$ supplied to the intermediate piece 20 or 49 further raises the power gain as shown in FIGS. 4 and 5. Furthermore, it is quite unexpected that the D.C. bias voltage $V_M$ not only keeps the low noise figure even with a deep negative D.C. bias or gain control voltage $V_{g2}$ but also makes it possible to effect the power gain control throughout a wide range of the gain control voltage $V_{g2}$ as evidenced in FIG. 5.

Figure 7:
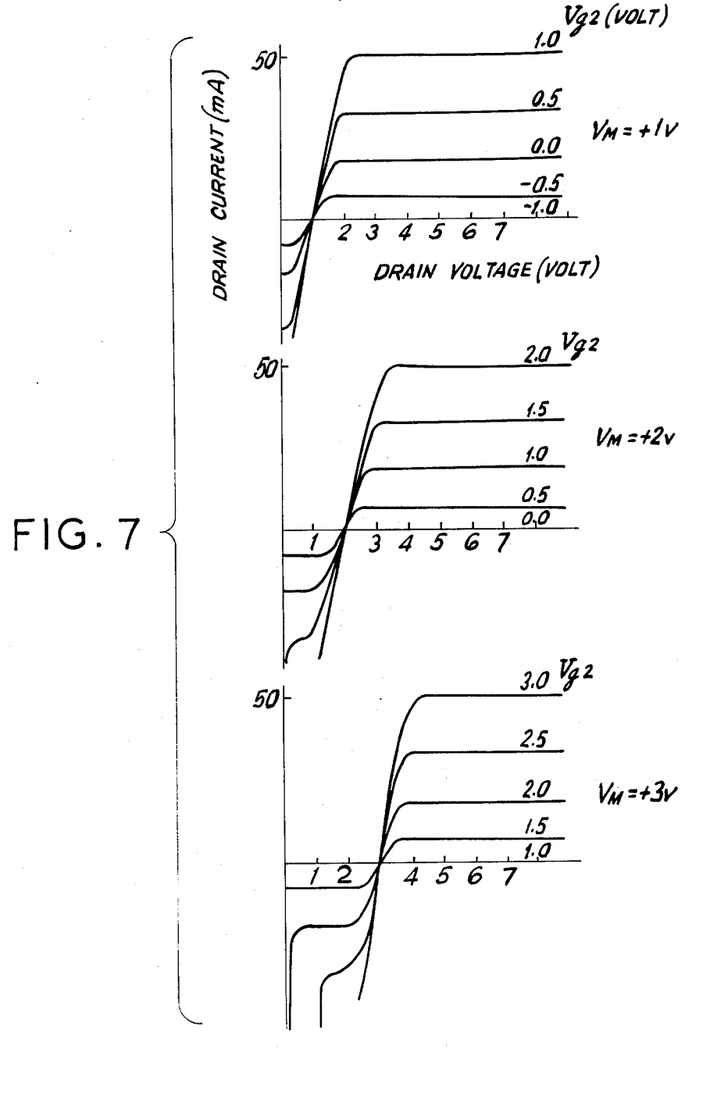
FIG. 7 shows electrical characteristics of a dual-gate MESFET according to this invention put into operation in the circuit depicted in FIG. 6.

Referring to FIG. 7, drain currents measured with the circuit illustrated with reference to FIG. 6 are shown versus the drain voltage $V_d$. The D.C. bias voltage for the intermediate piece or electrode was stepwisely set at 1, 2, and 3 volts. The second gate D.C. bias voltage $V_{g2}$ was used as the parameter. Irrespective of the first gate D.C. bias voltage $V_{g1}$, the drain current shows the pentode-type characteristics. The characteristic curves coincide with one another when the intermediate electrode D.C. bias voltage $V_M$ is varied in correspondence with the drain voltge $V_d$ and the second gate D.C. bias voltage $V_{g2}$. This shows that the second section of an MESFET according to this invention operates independently on the first gate voltage $V_{g1}$ and that the first section is not affected by the second gate voltage $V_{g2}$. In other words, each of the first and the second sections operates as an independent single-gate MESFET of the pentode type. Accordingly, the noise figure of a device according to this invention is kept at a low value of the single-gate MESFET irrespective of the intermediate electrode voltage $V_M$. Furthermore, the maximum power gain of the device is about twice as large in decibels as that of a single-gate MESFET when the intermediate electrode voltage is of an adequate value, such as between 1.3 and 6 volts.

On the other hand, the first section of a conventional dual-gate MESFET operates as a triode or a pentode according to the value of the second gate voltage $V_{g2}$ although the second section operates as a pentode irrespective of this second gate voltage $V_{g2}$. In the range of the second gate voltage $V_{g2}$ where the first section operates as a triode and where power gain control is effective, the first section undesirably raises the noise figure of the device.

According to two pairs of curves, similar to the curves B, B', D, and D' depicted in FIG. 5, the noise figures undesirably increase at 4 GHz as large as 4 dB and only 1 dB when the power gains are adjusted by −7dB in the cases of a conventional dual-gate MESFET and an intermediate-piece-biased MESFET according to this invention, respectively. A difference of 3 dB between the undesired increases in the noise figure is very important in the art. It is believed that the residual increase of 1 dB in the noise figure of the D.C. biased MESFET according to this invention is caused mainly by the noise inevitably generated in the second section.

Figure 8:
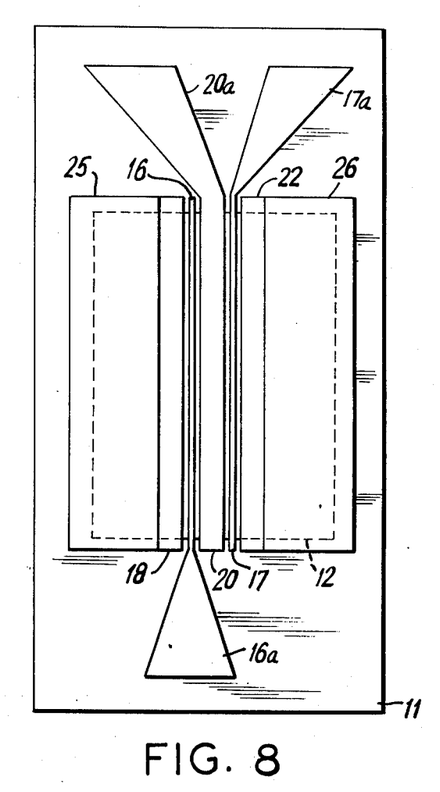
FIG. 8 is a plan of a dual-gate MESFET manufactured by a method according to the first or second embodiment of this invention.

Referring now to FIG. 8, a dual-gate MESFET with a modification according to an aspect of this invention is provided with an extension 20a of the intermediate piece 20 on the surface of the semiconductor crystal 11. The extension 20a and the intermediate piece 20 are coated with a gold film (not shown) of 1 to 2 microns in thickness. The extension 20a serves as an electrode for the intermediate piece, namely, as a pad to be bonded to a terminal or a strip line (not shown). The length, in the sense defined hereinabove, of the intermediate piece 20 and the thickness of the gold coating for increasing the conductivity of the piece 20 are determined in consideration of the facts that the phase delay which unavoidably occurs between the gate pieces 16 and 17 varies with the length and that the power gain varies with the conductivity. In an example designed for 10GHz use, the length and the thickness are 30 microns and 1 micron, respectively. A dual-gate MESFET having an intermediate electrode 20a D.C. biased serves well as an H.F. amplifier of low noise and constant power gain.

Figure 9:
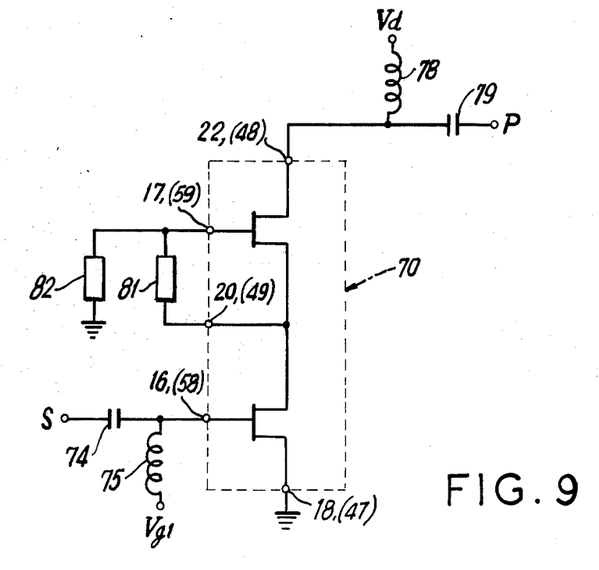
FIG. 9 shows a circuit for operating a dual-gate MESFET according to a specific embodiment of this invention.

Referring to FIG. 9, a dual-gate MESFET according to a specific embodiment of this invention is an MESFET arrangement that comprises a dual-gate MESFET 70 comprising, in turn, a source piece 18 (47), a first gate piece 16 (58), an intermediate piece 20 (49), a second gate piece 17 (59), and a drain piece 22 (48). The arrangement further comprises a first circuit element 81 and, if desired, a second circuit element 82. The first circuit element 81 has a first end connected to the intermediate piece 20 (49) and a second end connected to the second gate piece 17 (59) and allows a D.C. current to flow therethrough, while substantially preventing an A.C. current from flowing therethrough. The second circuit element 82 has a first end connected to the second gate electrode 17 (59) and a second end connected to the source piece 18 (47) and allows an A.C. current to flow therethrough, substantially preventing a D.C. current from flowing therethrough. Each of these circuit elements 81 and 82 may comprise a passive circuit element, such as an inductor or a capacitor, an active circuit element, or a combination of passive and active ones. The intermediate piece 20 (49) should be left floating. In other respects, a circuit for putting this arrangement into operation is similar to that illustrated with reference to FIG. 6. With the circuit shown in FIG. 9, the MESFET serves as an amplifier of high and constant power gain. The first circuit element 81 serves to slightly bias the second gate piece 17 (59) together with the intermediate piece 20 (49) so as to prevent an excess current from flowing therethrough to damage the same.

Figure 10:
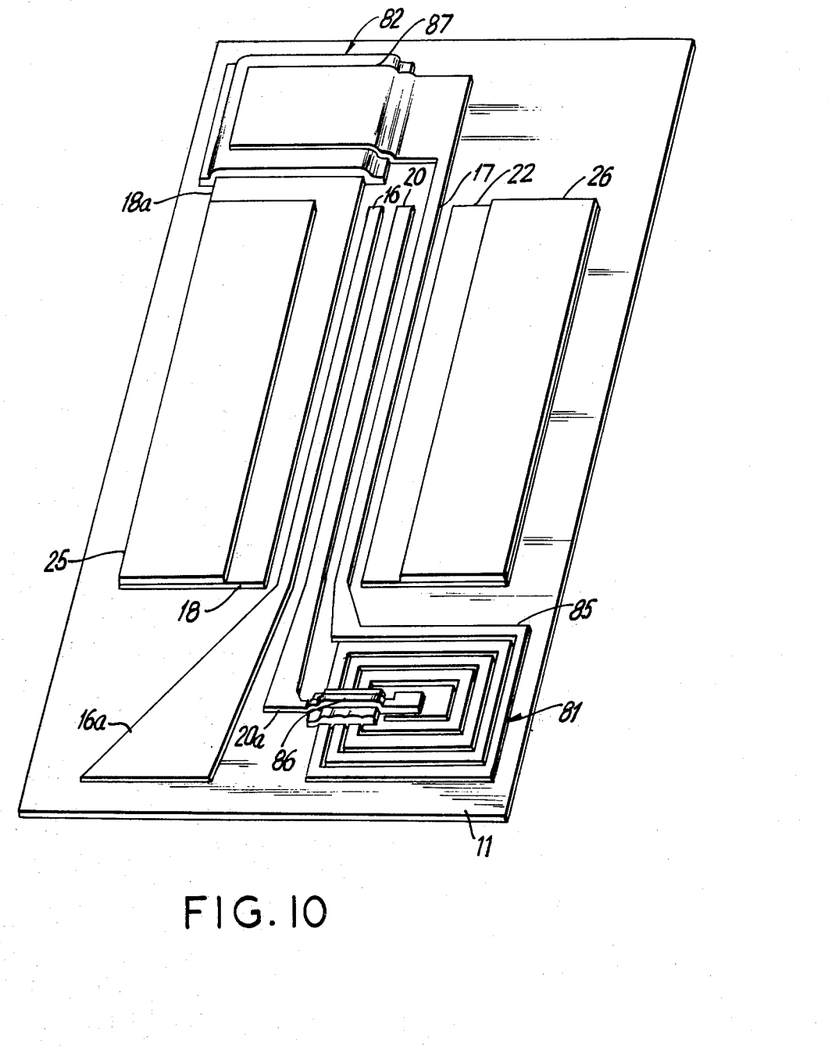
FIG. 10 is a perspective view of an example of a dual-gate MESFET according to the specific embodiment illustrated in FIG. 9.

Finally referring to FIG. 10, an MESFET according to an aspect of the specific embodiment of this invention comprises the first circuit element 81 formed integrally on and above the surface of the semiconductor crystal 11. The ciruit element 81 comprises a first extension 85 of one of the first metal pieces 17 on the crystal surface in a spiral shape, an extension 20a of the intermediate piece 20, and a bond 86 electrically connecting the extensions 85 and 20a together. The first metal piece 17 should be used as the second gate electrode. In other words, the second metal pieces 18 and 22 disposed remote from and adjacent to the first metal piece 17 should be used as a source and a drain electrode, respectively. Preferably, the MESFET further comprises the second circuit element 82 comprising, in turn, an extension 18a of the source piece 18 on the crystal surface and a second extension 87 of the second gate piece 17 in juxtaposition over the source extension 18a to provide a capacitor. With an MESFET according to the preferred aspect of the specific embodiment, it is unnecessary to provide a second gate electrode for connection to an external circuit. For 10GHz use, the inductance should be 10nH or more. The capacity of the capacitor 82 should be 20 pF or more. An MESFET according to the preferred aspect and having an intermediate piece 20 of 1 micron in length, a first and a second gate piece 16 and 17, each 1 micron in length, and a source and a drain piece 18 and 22, each 300 microns in length, showed a maximum power gain of 16.2 dB and a minimum noise figure of 3.0 dB at 10GHz with the intermediate piece 20 left floating.

While this invention has thus far been described in conjunction with preferred embodiments and modifications thereof, it should be clearly understood that other embodiments and modifications are possible within the scope of the appended claims. The MESFET's, illustrated with reference to FIGS. 2, 8, and 10 may be manufactured by a method according to the second embodiment to have passivation mask pieces on the planar surface of the substrate 12. The passivation mask may be extended to the surface of the semiconductor crystal 11 and between the spirally extended first extension 85. The extension or extensions, such as 20a or 20a and 18a of the ohmic contact piece 20 or pieces 20 and 18, may be formed on the cyrstal surface with an insulating film interposed. The extensions 16a and 17a or 85 and 87 may also be insulated from the semiconductor crystal 11. It should be noted in conjunction with the specific embodiment illustrated with reference to FIGS. 9 and 10 that the second circuit element 82 may be a discrete circuit element disposed outside of the substrate 12 although indispensable. In conjunction with the first and the second embodiments, the substrate may be of a p-type semiconductor when the dual-gate MESFET's manufactured by the methods are not for operation at extraordinarily high frequencies.

What is claimed is:

1. A dual-gate Schottky barrier gate field effect transistor including a substrate of a semiconductor having a planar surface, a pair of first metal film pieces for use as a first and a second gate electrode on said planar surface, and a pair of second metal film pieces for use as a source and a drain electrode on said planar surface on both sides of said pair of first metal film pieces, wherein the improvement comprises an intermediate metal film piece on said planar surface between said first metal film pieces with a space left between said intermediate metal film piece and each of said first metal film pieces, said intermediate metal film piece being of a metal capable of forming an ohmic contact with said semiconductor substrate at least at its portion contiguous to said planar surface.

2. A dual-gate Schottky barrier gate field effect transistor as claimed in claim 1, wherein the spaces between said intermediate metal film piece and said first metal film pieces are not wider than about two microns.

3. A dual-gate Schottky barrier gate field effect transistor as claimed in claim 1, wherein said semiconductor substrate is essentially of gallium arsenide, and said first pieces are essentially of aluminium.

4. A dual-gate Schottky barrier gate field effect transistor as claimed in claim 3, wherein said metal is gold-germanium.

5. A dual-gate Schottky barrier gate field effect transistor as claimed in claim 1, further comprising a first circuit element on said planar surface connecting said intermediate metal film piece and one of said first metal film pieces, said first circuit element allowing a d.c. current to flow therethrough and substantially preventing an a.c. current from flowing therethrough.

6. A dual-gate Schottky barrier gate field effect transistor as claimed in claim 5, further comprising a second circuit element on said planar surface connecting said one of said first metal film pieces and the second metal film pieces, said second circuit element allowing an a.c. current to flow therethrough and substantially preventing a d.c. current from flowing therethrough.

7. A dual-gate Schottky barrier gate field effect transistor as claimed in claim 1, wherein said intermediate metal film piece is for use as an intermediate electrode.

8. A dual-gate Schottky barrier gate field effect transistor as claimed in claim 7, further comprising a circuit element connected to said intermediate metal film piece, said circuit element comprising inductive means.

9. A dual-gate Schottky barrier gate field effect transistor as claimed in claim 8, further comprising a d.c. source, said circuit element connecting said d.c. source and said intermediate metal film piece.

10. A dual-gate Schottky barrier gate field effect transistor as claimed in claim 1, manufactured by a method comprising the steps of forming a first film on said planar surface, forming a pair of mask pieces locally on said first film to leave uncovered portions of said first film on both sides of said pair of mask pieces and between said mask pieces, removing said uncovered portions and these parts of said first film which underlie said mask pieces and are contiguous to said uncovered portions to leave as said first metal film pieces those portions of said first film unremoved each of which extends between the contiguous parts, and projecting said metal towards said planar surface substantially perpendicularly thereof to form a second film on said mask pieces and on those areas of said planar surface which are exposed to the projected metal, thereby providing said second metal film pieces and said intermediate metal film piece by the second film portions deposited on the exposed planar surface areas, said first film being formed of a metal capable of forming a Schottky barrier with said semiconductor.

11. A dual-gate Schottky barrier gate field effect transistor as claimed in claim 10, said method further comprising the step of removing, after said projecting step, said mask pieces and those portions of said second film which lie on the resepective mask pieces.

12. A dual-gate Schottky barrier gate field effect transistor as claimed in claim 10, wherein said first film portion removing step of said method is carried out to remove said contiguous parts not farther than about two microns into those portions of said first film which underlie the respective mask pieces from each interface between the underlying portion and the adjacent uncovered portion.

13. A dual-gate Schottky barrier gate field effect transistor as claimed in claim 1, further comprising passivation film pieces between said first and said second metal film pieces and between said first and said intermediate metal film pieces, said transistor being manufactured by a method comprising the steps of:

forming a first mask film of a first masking material on said planar surface, said first masking material being resistant to a first and a second corrosive agent, susceptible to a third corrosive agent, resistant to a fourth corrosive agent, and capable of serving as a passivation layer, said semiconductor being resistant to said first corrosive agent;

forming a second mask film of a second masking material on said first mask film, said second masking material being susceptible to said first corrosive agent and resistant to said second corrosive agent;

forming a pair of mask elements locally on said second mask film to leave uncovered portions thereof on both sides of said pair of mask elements and between said mask elements, said mask elements being resistant to said first corrosive agent and susceptible to said second corrosive agent;

removing said uncovered portions together with first mask films portions underlying the respective uncovered portions to leave a pair of two-layer portions under the respective mask elements and to expose first areas of said planar surface on both sides of said pair of two-layer portions and between said two-layer portions, each of said two- layer portions consisting of those portions of said first and said second mask films which are under a pertinent one of said mask elements, said uncovered second mask film portions and the underlying first mask film portions being removed so as to leave each of said two-layer portions with a pair of side surfaces formed substantially perpendicularly of said planar surface;

removing by said first corrosive agent those parts of said second mask film which are under said mask elements and are contiguous to said surfaces to leave a pair of second mask film pieces on central portions of a pair of first mask film pieces of the respective two-layer portions;

projecting said metal towards said planar surface substantially perpendicularly thereof to form a first metal film on the first planar surface areas and on said mask elements, thereby providing said second pieces and said intermediate piece by the first metal film portions deposited on both sides of said pair of first mask film pieces and between said first mask film pieces, respectively, said intermediate metal film piece having a first metal surface area substantially parallel to said planar surface, said metal being resistant to said second and said fourth corrosive agents;

removing by said second corrosive agent said mask elements together with first metal film portions deposited thereon;

projecting a third masking material resistant to said first and said third corrosive agents and susceptible to said fourth corrosive agent towards said first metal film substantially perpendicularly of said first metal film surface area to form a third mask film on said second and said intermediate metal film pieces, said second mask film pieces, and said first mask film pieces less the respective central portions;

removing by the use of said first corrosive agent said second mask film pieces together with third mask film portions lying thereon to locally expose said first mask film pieces at said central portions;

removing by the use of said third corrosive agent said central portions of said first mask film to expose those second areas of said planar surface which were under said central portions;

projecting a metal capable of forming a Schottky barrier with said semiconductor and resistant to said fourth corrosive agent towards said planar surface substantially perpendicularly thereof to form a second metal film on the second planar surface areas and on unremoved portions of said third mask film, thereby providing said first metal film pieces by the second metal film portions deposited on said second planar surface areas; and removing by the use of said fourth corrosive agent said unremoved third mask film portions together with second metal film portions lying thereon;

said first mask film pieces less said central portions serving as said passivation mask pieces.

* * * * *

UNITED STATES PATENT OFFICE
CERTIFICATE OF CORRECTION

Patent No. 4,048,646            Dated September 13, 1977

Inventor(s) Masaki Ogawa et al

It is certified that error appears in the above-identified patent and that said Letters Patent are hereby corrected as shown below:

IN THE CAPTION:

Under Foreign Application Priority Data, please insert:

-- Feb. 20, 1976 Japan.......51-17774 --

Signed and Sealed this

Twenty-first Day of March 1978

[SEAL]

Attest:

RUTH C. MASON
Attesting Officer

LUTRELLE F. PARKER
Acting Commissioner of Patents and Trademarks